(12) United States Patent
Bruce et al.

(10) Patent No.: US 7,793,172 B2
(45) Date of Patent: Sep. 7, 2010

(54) CONTROLLED RELIABILITY IN AN INTEGRATED CIRCUIT

(75) Inventors: Klas M. Bruce, Leander, TX (US);
Andrew C. Russell, Austin, TX (US);
Shayan Zhang, Austin, TX (US);
Bradford L. Hunter, South Burlington, VT (US)

(73) Assignee: Freescale Semiconductor, Inc., Austin, TX (US)

( * ) Notice: Subject to any disclaimer, the term of this patent is extended or adjusted under 35 U.S.C. 154(b) by 1014 days.

(21) Appl. No.: 11/536,342

(22) Filed: Sep. 28, 2006

(65) Prior Publication Data

US 2008/0091990 A1    Apr. 17, 2008

(51) Int. Cl.
*G11C 29/00*   (2006.01)
*G11C 11/4074*   (2006.01)

(52) U.S. Cl. ..................................................... 714/708
(58) Field of Classification Search .................. 714/708
See application file for complete search history.

(56) References Cited

U.S. PATENT DOCUMENTS

| | | | |
|---|---|---|---|
| 5,420,798 A | 5/1995 | Lin et al. |
| 5,436,513 A | 7/1995 | Kaye et al. |
| 5,801,985 A | 9/1998 | Roohparvar et al. |
| 5,875,135 A | 2/1999 | Patwardhan et al. |
| 6,128,236 A | 10/2000 | Faue et al. |
| 6,462,998 B1 | 10/2002 | Proebsting |
| 6,522,161 B2 | 2/2003 | Lunde et al. |
| 6,552,357 B2 | 4/2003 | Akita |
| 6,597,620 B1 | 7/2003 | NcMinn |
| 6,628,552 B1 | 9/2003 | Larsen et al. |
| 6,724,648 B2 | 4/2004 | Khellah et al. |
| 6,738,292 B2 | 5/2004 | Shioyama |
| 6,781,904 B2 | 8/2004 | Lee et al. |
| 6,807,101 B2 | 10/2004 | Ooishi et al. |
| 6,809,538 B1 | 10/2004 | Borkar |
| 6,980,476 B2 | 12/2005 | Do |
| 7,042,776 B2 | 5/2006 | Canada et al. |
| 7,072,779 B2 | 7/2006 | Hancock et al. |

(Continued)

OTHER PUBLICATIONS

International Search Report for coordinating PCT Application No. PCT/US2008/076512 of related U.S. Appl. No. 11/875,997, mailed Mar. 31, 2009.

(Continued)

*Primary Examiner*—Stephen M Baker
(74) *Attorney, Agent, or Firm*—James L. Clingan, Jr.; Ranjeev Singh

(57) ABSTRACT

Methods and systems for configuring characteristics associated with at least one portion of a memory array comprising addressable units are provided. In one aspect, a method for controlling a power supply voltage for a memory array comprises detecting whether an error occurred in performing a read operation on an addressable unit of the memory array using a first power supply voltage coupled to the memory array. The method further comprises incrementing an error counter for tracking an error count associated with the memory array and switching the memory array to a second power supply voltage if the error count is equal to or exceeds an error threshold for the memory array. The method further comprises, based on at least one condition, switching the memory array to the first power supply voltage and resetting the error counter to an initial value.

20 Claims, 2 Drawing Sheets

U.S. PATENT DOCUMENTS

| | | |
|---|---|---|
| 7,126,863 B2 | 10/2006 | Janzen |
| 7,126,868 B2 | 10/2006 | Mizuno et al. |
| 7,158,432 B1 | 1/2007 | Hunter et al. |
| 7,292,495 B1 | 11/2007 | Kenkare et al. |
| 7,542,369 B2 | 6/2009 | Kenkare et al. |
| 2004/0025065 A1 | 2/2004 | Lou |
| 2004/0130930 A1 | 7/2004 | Houston |
| 2005/0024917 A1 | 2/2005 | Yamaoka et al. |
| 2005/0132238 A1 | 6/2005 | Nanja |
| 2005/0286193 A1 | 12/2005 | Alokby |
| 2006/0018160 A1 | 1/2006 | Moogat et al. |
| 2006/0039182 A1 | 2/2006 | Sakurai et al. |
| 2006/0056229 A1 | 3/2006 | Maeda et al. |
| 2006/0128348 A1 | 6/2006 | Jang |
| 2006/0236162 A1* | 10/2006 | Zeighami et al. ............ 714/718 |
| 2006/0279318 A1* | 12/2006 | Iwaya ........................ 324/765 |
| 2006/0280019 A1* | 12/2006 | Burton et al. ............... 365/226 |
| 2007/0047358 A1 | 3/2007 | Oh |
| 2008/0091990 A1 | 4/2008 | Bruce et al. |

OTHER PUBLICATIONS

Notice of Allowance on Related U.S. Appl. No. 11/875,997.

Zhang, K.; "A 3-GHz 70-Mb SRAM in 65-nm CMOS Technology With 151; Integrated Column-Based Dynamic Power Supply"; IEEE Journal of Solid-State Circuits; Jan. 2006; pp. 146-151; vol. 41, No. 1; IEEE.

* cited by examiner

CONTROLLED RELIABILITY IN AN INTEGRATED CIRCUIT

FIELD OF THE INVENTION

This invention relates to integrated circuits, and more particularly to ones in which reliability is controlled.

BACKGROUND OF THE INVENTION

Reducing power consumption is a continuing desire in integrated circuits. One way of reducing power consumption is by reducing the voltage that powers the circuits. There is a limit though beyond which the circuits will not operate. Thus there is a limit on how low the power supply voltage can be reduced for reliable operation. One technique that has been developed has been to vary the power supply voltage based on predetermined criteria. This can be continuously variable or variable in increments based on conditions in a look-up table.

There is a continuing need for further improvement in controlling power savings while maintaining sufficient reliability for a given performance level.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a circuit has a memory which is provided with a power supply voltage and a latency adjustment based on a count of errors from an error correction code (ECC) circuit. The relatively low voltage, for reducing power consumption, may conveniently be the relatively low voltage used by an on-board CPU and the higher voltage, used for increasing reliability, may conveniently be an externally supplied power supply voltage. Thus if sufficiently high reliability memory operation is available using the CPU power supply voltage, which is the relatively low voltage, there is no need to switch to the higher power supply voltage. On the other hand if the memory needs a higher voltage for a more reliable operation, the higher voltage is provided to the memory. Similarly, latency or internal memory timing is selectable to obtain the preferred speed or reliability. This is better understood by reference to the drawings and the following description.

Figure 1:
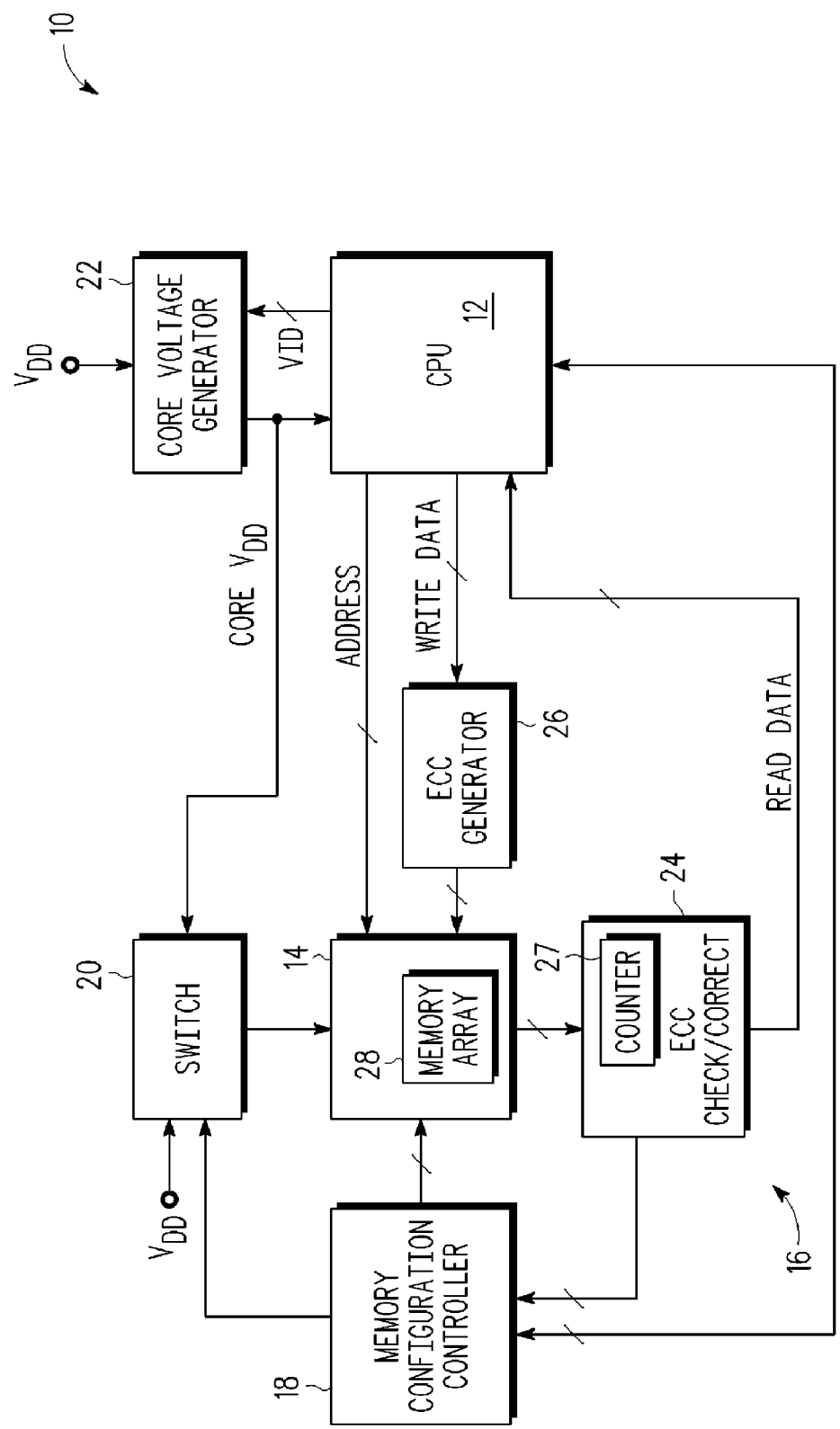
FIG. 1 is a block diagram of a circuit according to one embodiment.

Shown in FIG. 1 is a system 10 on an integrated circuit comprising a central processing unit (CPU) 12, a memory 14 coupled to CPU 12; an error correction code (ECC) circuit 16 coupled to CPU 12 and memory 14; a memory configuration controller 18 coupled to CPU 12, memory 14, and ECC CIRCUIT 16; a switch 20 coupled to memory 14, memory configuration controller 18, and coupled to receive a power supply VDD; and a core voltage generator 22 coupled to CPU 12, switch 20, and coupled to receive power supply VDD. ECC circuit 16 comprises an ECC check/correct circuit 24 and an ECC generator 26. ECC check/correct circuit 24 is coupled to memory 14, memory configuration controller 18, and CPU 12. A counter 27 is present in ECC check/correct circuit 24. ECC generator 26 is coupled to CPU 12 and memory 14. Core voltage generator 22 generates a core VDD from power supply voltage VDD, which would typically be provided externally from the integrated circuit. The core VDD is provided as a variable power supply voltage for use by CPU 12 and other logic and also potentially by 14. The particular voltage supplied as the core VDD is selected based on identification information supplied by CPU 12 as voltage identification VID.

Memory 14 has a memory array 28 of addressable units and also has other circuitry such as sense amplifiers, buffers, and decoders. The memory array itself may have a different power supply voltage than the other circuitry. CPU 12 is user accessible.

Figure 2:
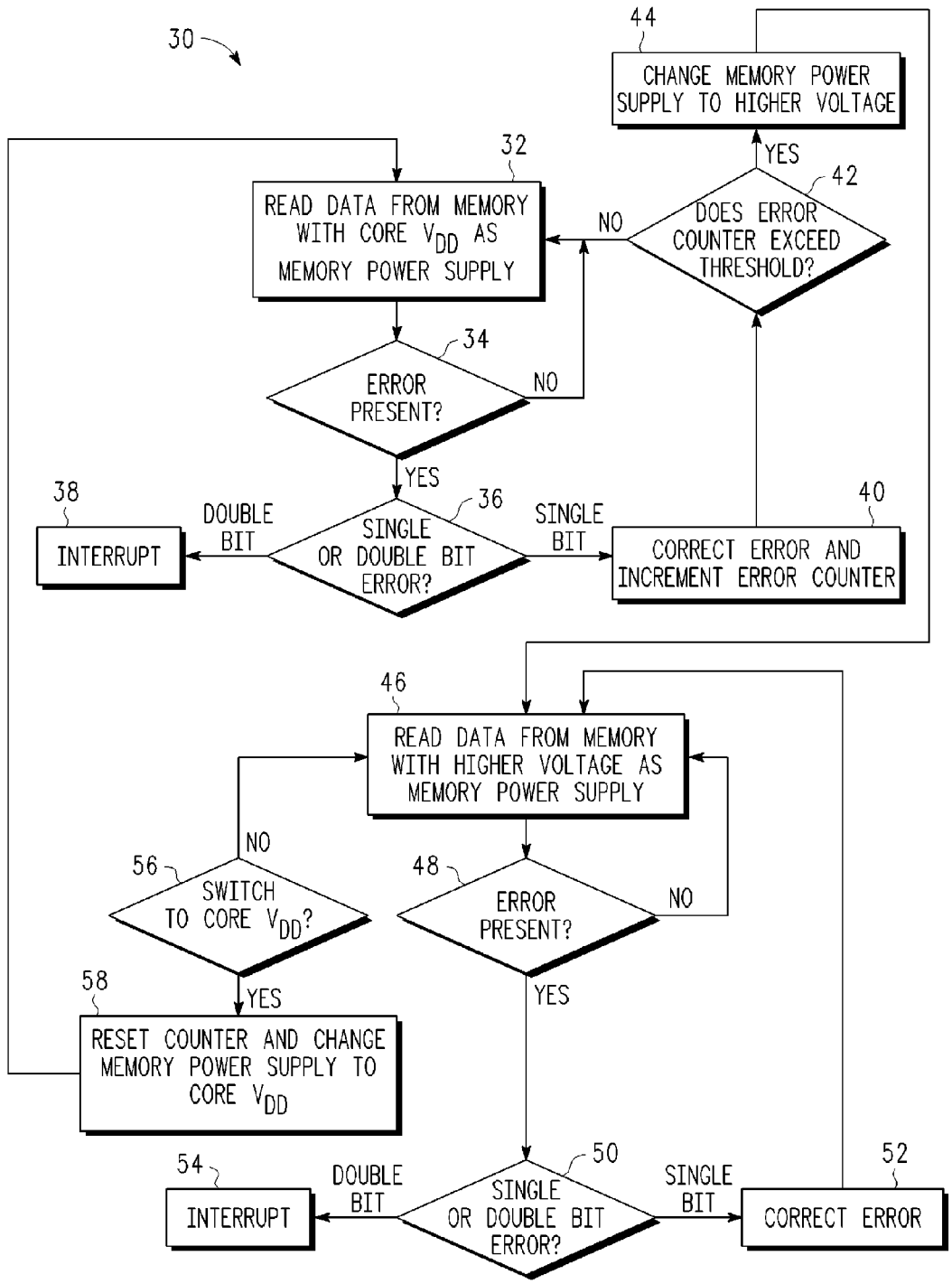
FIG. 2 is a flow diagram for operating the circuits of FIG. 1.

Shown in FIG. 2 is a flow diagram 30 useful in understanding the operation of system 10. In operation, power consumption is preferably reduced by powering memory 14 with core VDD which is reduced in voltage from power supply VDD and thus results in less power being consumed by memory 14 than if power supply VDD were used. At step 32, data is read from memory 14 with core VDD as the memory supply voltage. At step 34, a determination is made as to whether an error is present. ECC check/correct circuit 24 is coupled to memory 14 to perform this function. If there is no error present, then there is no change and data can continue to be read from memory 14 using the core VDD as the power supply. If there is an error, at step 36 a determination is made as to whether it is a single bit error or a double bit failure. If there is more than one error, it is considered a double bit error. If it is a double bit error, an interrupt is performed by CPU 12 as shown in step 38. A double bit failure in this exemplary approach is not correctable thus causing the need for a significant action. ECC circuits, in this exemplary approach, such as ECC circuit 16, that detect but do not correct double bit failures are common. A double bit failure is a very disruptive event. It may indicate that an operation cannot even be performed without first doing something such as a reset. Thus it is very desirable to avoid double bit failures. Other error detection and correction schemes may have another error type that is particularly desirable to avoid.

If there is a single bit failure, in step 40 the error is corrected and counter 27 is incremented to keep track of the errors that have been detected. This counter function is shown as being performed by ECC check/correct circuit 24, but the counter could alternatively be present in CPU 12 or memory configuration controller 18 or an alternative location not shown. If a threshold of the counter is not exceeded, the memory power supply is retained using the core VDD. If, on the other hand, the threshold of the counter is exceeded, in step 44 the memory power supply is increased, in this example to power supply VDD. A correlation between having a number of single bit errors and ultimately having a double bit error has been discovered. Furthermore, when a circuit is operating at voltage, frequency or temperature that is at the limit of reliable operation, further reduction in voltage, or increase in frequency or temperature will cause single bit errors to occur before any double bit errors occur. Thus, even though single bit errors are correctable, having a sufficient number of them is an indicator of the likely occurrence of a double bit failure and the corresponding adverse consequences of that. This is mitigated by increasing the power supply voltage to memory 14. Switch 20 performs the function of switching between the core VDD and power supply VDD under the control of memory configuration controller 18. Thus one configuration for memory 14 is using the core VDD and another is using power supply VDD.

In the case where memory 14 is in the configuration of using the power supply VDD, in step 46 reading of memory 14 continues using the higher memory power supply voltage.

In step 48 errors continue to be detected. If an error is not detected, then memory 14 continues reading as required by CPU 12. If an error is detected, in step 50 a determination is made as to whether it is a single or double bit error. If it is double bit, then in step 54 an interrupt is generated. The consequence of a double bit error is unchanged but is less likely to occur due to the higher power supply voltage. If the error is a single bit error, in step 52 the error is corrected and reading continues as shown in step 46. At anytime, as shown in step 56 there can be decision to switch back to the core VDD for the memory power supply. The decision can also be to keep the memory power supply at VDD. This type of decision could be made by CPU 12 or memory configuration controller 18. Thus, ECC circuit 16 can be used to determine when double bit errors have an increased likelihood by counting single errors and then responding by increasing the voltage to memory 14 to reduce the likelihood of the double bit errors. This is particularly conveniently done using the core VDD which is a reduced voltage power supply that is already present for reducing power consumption of CPU 12 and then switching to power supply VDD which has to be present because it is necessary for generating the core VDD.

Another configuration difference that can be useful in improving reliability is with regard to latency. A memory will generally take a certain number of clock cycles, called latency, to provide a result. Errors can begin appearing as a result of the number of clock cycles being marginally sufficient. In such a case, the latency would preferably be increased to improve reliability and particularly to reduce the likelihood of double bit failures, or the memory latency can be increased in order to support a higher clock rate for overall better performance at lower a voltage while controlling the correctable single bit error rate. This can be achieved with the use of memory configuration controller 18 using substantially the same methodology as for configuring memory 14 for its power supply voltage.

As reads of memory 14 occur and single errors accumulate to reach some threshold, then memory configuration controller can increase the latency of memory 14. Thus, once the threshold is met, memory 14 would increase the number of clock cycles that would be required to perform read. For example, an L2 (level 2) cache may have a three cycle latency. If the single bit failures reach a level considered to be indicative of a likelihood of double bit failures, the latency would be increased to four.

Another configuration type can be internal timing of memory 14. It has become more common for the internal timing to be programmable for many of the timing functions of a memory such as when a sense amplifier is enabled and precharge is begun and terminated.

This is something that can also be configured by memory configuration controller 18. When single bit failures reach a certain level, the internal timing of memory 14 can be relaxed. For example, the sense amplifiers can be enabled later and for a longer duration to improve sensing reliability. Thus, one configuration of memory 14 could be considered high speed timing and another could be considered relaxed timing, without changing latency.

In one aspect the embodiment can be characterized as a method for controlling a power supply voltage for a memory array comprising addressable units. The method includes detecting whether an error occurred in performing a read operation on at least one addressable unit of the memory array using a first power supply voltage coupled to at least one portion of the memory array. It further includes, if an error is detected, then incrementing an error counter for tracking an error count associated with the at least one portion of the memory array. The method continues with switching the at least one portion of the memory array to a second power supply voltage if the error count is equal to or exceeds an error threshold for the at least one portion of the memory array. The method further continues, based on at least one condition, with switching the at least one portion of the memory array to the first power supply voltage and resetting the error counter to an initial value.

In a further aspect the method may be further characterized by the at least one condition is evaluated by a memory configuration controller wherein the at least one condition relates to a signal from a user requesting a change in the power supply voltage, a signal from a dynamic voltage and frequency scaling unit indicating a change in a value of the first supply voltage, an elapse of a predetermined time from a time at which the memory array is switched from the first power supply voltage to the second power supply voltage, a signal from CPU 12 or memory configuration controller 18 requesting a change in memory latency, refresh rate, or an error-free counter exceeding an error-free count threshold in which the error-free counter is incremented based on when a read operation on the memory array does not result in an error. As an example for refresh rate which is applicable to dynamic random access memories (DRAMs), there may be a first refresh rate and a second refresh rate each associated with at least a portion of the memory array. Time and count thresholds may be stored in volatile user or software programmable registers or in non-volatile registers that can be programmed after manufacture.

Various other changes and modifications to the embodiments herein chosen for purposes of illustration will readily occur to those skilled in the art. For example, ECC circuit 16 was described as not being able to correct double bit errors but other error detection and correction schemes having a different characteristic may be found to be effective. Examples were described to aid in understanding. It was not intended that these examples were the only examples. To the extent that such modifications and variations do not depart from the spirit of the invention, they are intended to be included within the scope thereof which is assessed only by a fair interpretation of the following claims.

What is claimed is:

1. A method for controlling a power supply voltage for a memory array comprising addressable units, the method comprising:

detecting whether an error occurred in performing a read operation on at least one addressable unit of the memory array using a first power supply voltage coupled to at least one portion of the memory array and to a processor, wherein the first power supply voltage is generated by a core voltage generator;

if an error is detected, then incrementing an error counter for tracking an error count associated with the at least one portion of the memory array;

switching the at least one portion of the memory array to a second power supply voltage if the error count is equal to or exceeds an error threshold for the at least one portion of the memory array;

continuing operation of the memory using the second power voltage independent of the error counter; and based on at least one condition independent of the error counter, switching the at least one portion of the memory array to the first power supply voltage and resetting the error counter to an initial value.

2. The method of claim 1 further comprising the processor communicating at least one voltage identifier to the core voltage generator, wherein the at least one voltage identifier corresponds to a specific value of the core voltage.

3. The method of claim 1, wherein the fixed power supply voltage is greater than the core voltage.

4. The method of claim 1, wherein the at least one condition is evaluated by a memory configuration controller and the at least one condition relates to:
   a signal from a user requesting a change in the power supply voltage;
   a signal from a dynamic voltage and frequency scaling unit indicating a change in a value of the first supply voltage;
   an elapse of a predetermined time from a time at which the memory array is switched from the first power supply voltage to the second power supply voltage;
   a signal from CPU 12 or memory configuration controller 18 requesting a change in memory latency; or
   an error-free counter exceeding an error-free count threshold, wherein the error-free counter is incremented based on when a read operation on the memory array does not result in an error.

5. The method of claim 1, wherein detecting whether the error occurred in performing the read operation on the at least one addressable unit of the memory array further comprises determining whether the error is a single-bit error or a double-bit error.

6. The method of claim 5 further comprising incrementing the error counter for tracking the error count associated with the at least one portion of the memory array only when the single-bit error is detected.

7. The method of claim 5 further comprising generating an interrupt for a processing core coupled to the memory array when the double-bit error is detected.

8. A method for configuring characteristics associated with at least one portion of a memory array comprising addressable units, the method comprising:
   detecting whether an error occurred in performing a read operation on at least one addressable unit of the memory array, wherein the at least one portion of the memory array is configured to operate based on a first set of characteristics;
   if an error is detected, then incrementing an error counter for tracking an error count associated with at least one portion of the memory array;
   if the error count is equal to or exceeds an error threshold for the at least one portion of the memory array, re-configuring the at least one portion of the memory array to operate based on a second set of characteristics, wherein the second set of characteristics differs from the first set of characteristics in terms of a value of at least one of the characteristics;
   continuing operate the memory array using the second set of characteristics independent of the error counter; and
   based on at least one condition that is independent of the error counter re-configuring the at least one portion of the memory array to operate based on the first set of characteristics and resetting the error counter to an initial value.

9. The method of claim 8, wherein the at least one condition is evaluated by a memory configuration controller and the at least one condition relates to:
   a signal from a user requesting a change from the first power supply voltage to the second power supply voltage;
   a signal from a dynamic voltage and frequency scaling unit indicating a change in a value of the first supply voltage;
   an elapse of a predetermined time from a time at which the at least one portion of the memory array is switched from the first power supply voltage to the second power supply voltage;
   an error-free counter exceeding an error-free count threshold, wherein the error-free counter is incremented based on when a read operation on the at least one portion of the memory array does not result in an error;
   a signal from a user requesting a change from the first latency value to the second latency value;
   a signal from a user requesting a change from the first refresh rate to the second refresh rate; and
   a signal from a user requesting a change from a first programmable delay value to a second programmable delay value.

10. The method of claim 8, wherein detecting whether the error occurred in performing a read operation on at least one addressable unit of the memory array further comprises determining whether the error is a single-bit error or a double-bit error and further comprising:
    incrementing the error counter for tracking the error count associated with the at least one portion of the memory array only when the single-bit error is detected; and
    if necessary, generating an interrupt for a processor coupled to the memory array when the double-bit error is detected.

11. The method of claim 8 further comprising dynamically changing the error threshold based on a signal from one of a user of the memory array or a signal from a processor coupled to the memory array.

12. The method of claim 8, wherein the first set of characteristics relates to at least one of a first power supply voltage coupled to the at least one portion of the memory array, a first latency value associated with the at least one portion of the memory array, a first refresh rate associated with the at least one portion of the memory array, and a first programmable delay value associated with the at least one portion of the memory array and the second set of characteristics relates to at least one of a second power supply voltage coupled to the at least one portion of the memory array, a second latency value associated with the at least one portion of the memory array, a second refresh rate associated with the at least one portion of the memory array, and a second programmable delay value associated with the at least one portion of the memory array.

13. The method of claim 12 further comprising generating the first power supply voltage using a core voltage generator, wherein the core voltage generator generates a core voltage for a processor coupled to the memory array.

14. The method of claim 13 further comprising the processor communicating at least one voltage identifier to the core voltage generator, wherein the at least one voltage identifier corresponds to a specific value of the core voltage.

15. A system for controlling a power supply voltage for a memory array comprising addressable units, the system comprising:
    an error detector/corrector for detecting whether an error occurred in performing a read operation on at least one addressable unit of the memory array using a first power supply voltage coupled to at least one portion of the memory array and using a first timing characteristic for accessing the at least one portion of the memory array; and
    a memory configuration controller:

for incrementing an error counter for tracking an error count associated with at least one portion of the memory array, in case an error is detected by the error detector, for switching the at least one portion of the memory array to a second power supply voltage if the error count is equal to or exceeds an error threshold for the memory array, continuing operation of the memory using the second power voltage independent of the error counter;

for switching the at least one portion of the memory array to the first power supply voltage and resetting the error counter to an initial value based on at least one condition that is independent of the error counter, and for changing at least one timing characteristic for accessing the at least one portion of the memory array if the error count is equal to or exceeds the error threshold for the at least one portion of the memory array.

16. The system of claim 15, wherein the memory configuration controller is further configured to change a refresh rate associated with the at least one portion of the memory array if the error count is equal to or exceeds the error threshold for the at least one portion of the memory array.

17. The system of claim 15, wherein the at least one condition evaluated by the memory configuration controller relates to:

a signal from a user requesting a change from the first power supply voltage to the second power supply voltage;

a signal from a dynamic voltage and frequency scaling unit indicating a change in a value of the first supply voltage;

an elapse of a predetermined time from a time at which the memory array is switched from the first power supply voltage to the second power supply voltage;

an error-free counter exceeding an error-free count threshold, wherein the error-free counter is incremented based on when a read operation on the at least one portion of the memory array does not result in an error;

a signal from a user requesting a change from the first latency value to the second latency value;

a signal from a user requesting a change from the first programmable delay value to the second programmable delay value; or a signal from a user requesting a change from the first refresh rate to the second refresh rate.

18. The system of claim 15 further comprising a switch coupled to the memory array, the first power supply voltage, and the second power supply voltage, such that the switch can be controlled by the memory configuration controller to couple either the first power supply voltage or the second power supply voltage to the at least one portion of the memory array.

19. The system of claim 15 further comprising a core voltage generator, wherein the core voltage generator generates a core voltage for a processor coupled to the memory array, wherein the core voltage corresponds to the first power supply voltage, wherein the second power supply voltage corresponds to a fixed voltage, and wherein the second power supply voltage is greater than or equal to the first power supply voltage.

20. A system for controlling a power supply voltage for a memory array comprising addressable units, the system comprising:

an error detector/corrector for detecting whether an error occurred in performing a read operation on at least one addressable unit of the memory array using a first power supply voltage coupled to at least one portion of the memory array and using a first timing characteristic for accessing the at least one portion of the memory array; and a memory configuration controller:

for incrementing an error counter for tracking an error count associated with at least one portion of the memory array, in case an error is detected by the error detector, for switching the at least one portion of the memory array to a second power supply voltage if the error count is equal to or exceeds an error threshold for the memory array, continuing operation of the memory using the second power voltage independent of the error counter;

for switching the at least one portion of the memory array to the first power supply voltage and resetting the error counter to an initial value based on at least one condition that is independent of the error counter, and for changing at least one timing characteristic for accessing the at least one portion of the memory array if the error count is equal to or exceeds the error threshold for the at least one portion of the memory array;

wherein the memory configuration controller is further configured to change a refresh rate associated with the at least one portion of the memory array if the error count is equal to or exceeds the error threshold for the at least one portion of the memory array.

* * * * *